(12) United States Patent
Thompson et al.

(10) Patent No.: US 7,070,867 B2
(45) Date of Patent: Jul. 4, 2006

(54) OLEDS HAVING N-TYPE DOPING

(75) Inventors: Mark E. Thompson, Anaheim Hills, CA (US); Simona Garon, Santa Monica, CA (US)

(73) Assignee: The University of Southern California, Los Angeles, CA (US)

(*) Notice: Subject to any disclaimer, the term of this patent is extended or adjusted under 35 U.S.C. 154(b) by 0 days.

(21) Appl. No.: 10/729,547

(22) Filed: Dec. 5, 2003

(65) Prior Publication Data

US 2005/0123793 A1    Jun. 9, 2005

(51) Int. Cl.
    H05B 33/12    (2006.01)
(52) U.S. Cl. .............. 428/690; 428/917; 313/504; 313/506
(58) Field of Classification Search .......... 428/690, 428/917, 212; 313/504, 506
    See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |
| 2002/0034656 A1 | 3/2002 | Thompson et al. | |
| 2002/0086180 A1* | 7/2002 | Seo et al. .............. | 428/690 |
| 2002/0182441 A1 | 12/2002 | Lamansky et al. | |
| 2003/0072964 A1 | 4/2003 | Kwong et al. | |
| 2003/0082406 A1* | 5/2003 | Murase et al. ......... | 428/690 |
| 2003/0230980 A1 | 12/2003 | Forrest et al. | |
| 2004/0207318 A1* | 10/2004 | Lee et al. ............ | 313/506 |

FOREIGN PATENT DOCUMENTS

WO    WO 02/074015    9/2002

OTHER PUBLICATIONS

Parthasarathy et al., "Lithium doping of semiconducting organic charge transport materials," J. Appl. Phys. (2001), 89(9), 4986-4992, (no month).

Zhou et al., "Low-voltage inverted transparent vacuum deposited organic light-emitting diodes using electrical doping," Appl. Phys. Lett. (2002) 81(5), 922-924, (no month).
Liu et al., "Efficient multiplayer organic light emitting diode," Synthetic Metals (2001), 122(1), 177-179, (no month).
Johansson et al., "Electronic Structure of tris(8-hydroxyquinoline) aluminum thin films in the pristine and reduced states," J. Chem. Phys. (1999), 111(5), 2157-2163, (no month).
Kido et al., "Bright organic Electroluminescent devices having a metal-doped electron-injecting layer," Appl. Phys. Lett. (1998), 73(20), 2866-2868, (no month).
Wu et al., "Improved efficiency of organic light-emitting devices employing bathocuproine doped in the electron-transporting layer," Semicond. Sci. Technol. (2003), 18 L49-L52, (no month).
Choong et al., Appl. Phys. Lett. (1998), 72(21), 2689-2691, (no month).
Baldo et al., "Highly efficient phosphorescent emission from organic Electroluminescent devices," Nature, vol. 395, 151-154 (1998), (no month).
Baldo et al., "Very high-efficiency green organic light-emitting devices based on electrophosphorescence," Appl. Phys. Lett., vol. 75, No. 3, 4-6 (1999), (no month).
Adachi et al., "Nearly 100% internal phosphorescent efficiency in an organic light emittng device," J. Appl. Phys., 90, 5048 (2001), (no month).
Shizuka et al., "Fluorescence Enhancement of Dibenzo-1 8-crown-6 by Alkali Metal Cations," J. Phys. Chem. 1980, 84, 994-999, (no month).
Lu et al., U.S. Appl. No. 09/931,948., filed Aug. 20, 2001, entitled "Transparent Electrodes".
Shtein et al., U.S. Appl. No. 10/233,470, filed Sep. 4, 2002, entitled "Process and Apparatus for Organic Vapor Jet Deposition".

* cited by examiner

Primary Examiner—Dawn Garrett
(74) Attorney, Agent, or Firm—Kenyon & Kenyon LLP

(57) ABSTRACT

The present invention provides an organic light emitting device comprising an anode, a cathode, and an organic layer disposed between the anode and the cathode, wherein the organic layer comprises a host material, an alkali metal or an alkaline earth metal, and a metal binding agent. In a preferred embodiment, the organic layer is an electron transport layer in which the metal binding agent may confine the alkali metal or the alkaline earth metal.

19 Claims, 17 Drawing Sheets

A.

B.

F_3

DBC

SC5

P4N

Ir(4,6-F$_2$ppy)$_2$(BPz$_4$)

p-(SiPh$_3$)$_2$Ph

OLEDS HAVING N-TYPE DOPING

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to OLEDs using improved n-type doping.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

In layers comprising organic materials and metal complexes, the number of charge carriers may be very low, significantly limiting the conductivity of the layer. A practical solution to this problem involves doping the film with redox active dopants, leading to controlled oxidation or reduction of the carrier transporter, creating a finite density of charge carriers. This process is analogous to p- and n-doping of Si to achieve high conductivity. Alq$_3$, phenanthrolines and other electron transporting materials have been successfully doped with Li to significantly enhance their conductivity. [(a) "Lithium doping of semiconducting organic charge transport materials." Parthasarathy G., Shen C., Kahn A., Forrest S. R. J. Appl. Phys. (2001), 89(9), 4986–4992. (b) "Low-voltage inverted transparent vacuum deposited organic light-emitting diodes using electrical doping." Zhou, X.; Pfeiffer, M.; Huang, J. S., Blochwitz-Nimoth, J., Qin, D. S.; Werner, A.; Drechsel, J.; Maennig, B.; Leo, K. Appl. Phys. Lett. (2002), 81(5), 922–924. (d) "Efficient multilayer organic light emitting diode." Liu, Z.; Pinto, J.; Soares, J.; Pereira, E. Synthetic Metals (2001), 122(1), 177–179. (e) "Electron structure of tris(8-hydroxyquinoline) aluminum thin films in the pristine and reduced states." Johansson, N.; Osada, T.; Stafstrom, S.; Salaneck, W. R.; Parente, V.; dos Santos, D. A.; Crispin, X.; Bredas, J. L. J. Chem. Phys. (1999), 111(5), 2157–2163. (f) "Bright organic electroluminescent devices having a metal-doped electron-injecting layer." Kido, Junji; Matsumoto, Toshio; Appl. Phys. Lett. (1998), 73(20), 2866–2868. (g) "Improved efficiency of organic light-emitting devices employing bathocuproine doped in the electron-transporting layer." Wu, Z.; Yang, H.; Duan, Yu; Xie, W.; Liu, S.; Zhao, Yi; Semicond. Sci. Technol. (2003), 18 L49-L52.]. However, there are two potential drawbacks of doping with Li. The first drawback of Li doping is that the number of free carriers generated by Li doping is far less than the amount of Li that is doped into the film (carriers/Li<10%). The low yield of free carriers is thought to be due to the formation of charge transfer complexes, or tightly bound ion pairs. ["Investigation of the interface formation between calcium and tris-(8-hydroxy quinoline) aluminum." Choong V.-E.; Mason, M. G.; Tang, C. W.; Gao Yongli; *Appl. Phys. Lett.* (1998), 72(21), 2689–2691]. A second problem of Li doping is that Li may be highly mobile, readily diffusing throughout a device. Li diffusion into layers that are not meant to be redox doped leads to marked degradation of device performance due to the formation of trapping or quenching sites. Clearly the problems with Li doping are related to its high charge density and small size.

SUMMARY OF THE INVENTION

The present invention provides an organic light emitting device comprising an anode, a cathode, and an organic layer disposed between the anode and the cathode, wherein the organic layer comprises a host material, an alkali metal or an alkaline earth metal, and a metal binding agent.

In another embodiment, the present invention provides an organic light emitting device comprising an anode, a cathode, a first organic layer disposed between the anode and the cathode wherein the first organic layer is an emissive layer; and a second organic layer disposed between the first organic layer and the cathode, wherein the second organic layer comprises an electron transporting host material, an alkali metal, and a metal binding agent.

BRIEF DESCRIPTION OF THE DRAWINGS

FIG. 12A shows an OLED having a device structure ITO/NPD (400 Å)/mCP(100 Å)/10% Ir(4,6-$F_2$ ppy)$_2$(BPz$_4$): p-(SiPh$_3$)$_2$Ph (250 Å)/$F_3$ (200 Å)/15% $F_3$:DBC (100 Å)/LiF/Al(1000 Å). FIG. 12B shows an OLED having a device structure ITO/NPD (400 Å)/10% Ir(4,6-$F_2$ ppy)$_2$(BPz$_4$): p-(SiPh$_3$)$_2$Ph (250 Å)/$F_3$ (200 Å)/15% $F_3$:DBC (100 Å)/LiF/Al (1000 Å).

DETAILED DESCRIPTION

Figure 1:
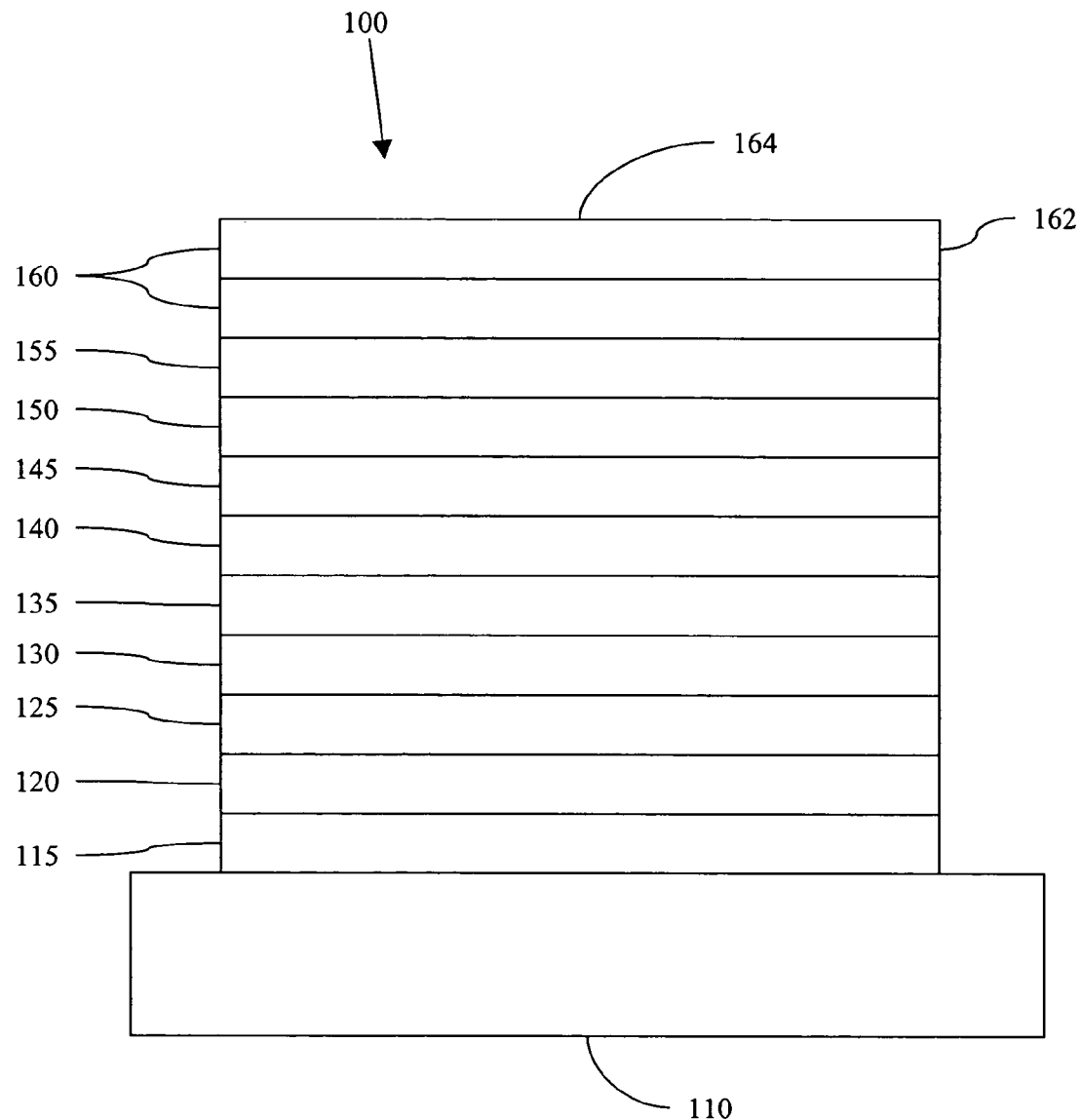
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

In one embodiment of the invention, the emissive material may be comprised of a alkali metal or an alkaline earth metal bound to a metal binding agent. In a preferred embodiment, the metal binding agent is an aryl substituted crown ether derivative.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

In one embodiment of the invention, the electron transport layer is comprised of an electron transport host and an n-type dopant. In this embodiment the n-type dopant is an alkali metal or an alkaline earth metal that is bound to a metal binding agent. Preferred metal binding agents include crowns, cryptands, and derivatives thereof.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

As would be generally understood by one skilled in the art, use of the term "blocking" layer is meant to suggest that the layer is comprised of a material, or materials, that provide a barrier that significantly inhibits transport of charge carriers and/or excitons through the layer, without suggesting or implying that the barrier completely blocks all charge carriers and/or excitons. The presence of such a barrier typically manifests itself in terms of producing substantially higher efficiencies as compared to devices lacking the blocking layer, and/or in terms of confining the emission to the desired region of the OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the EP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
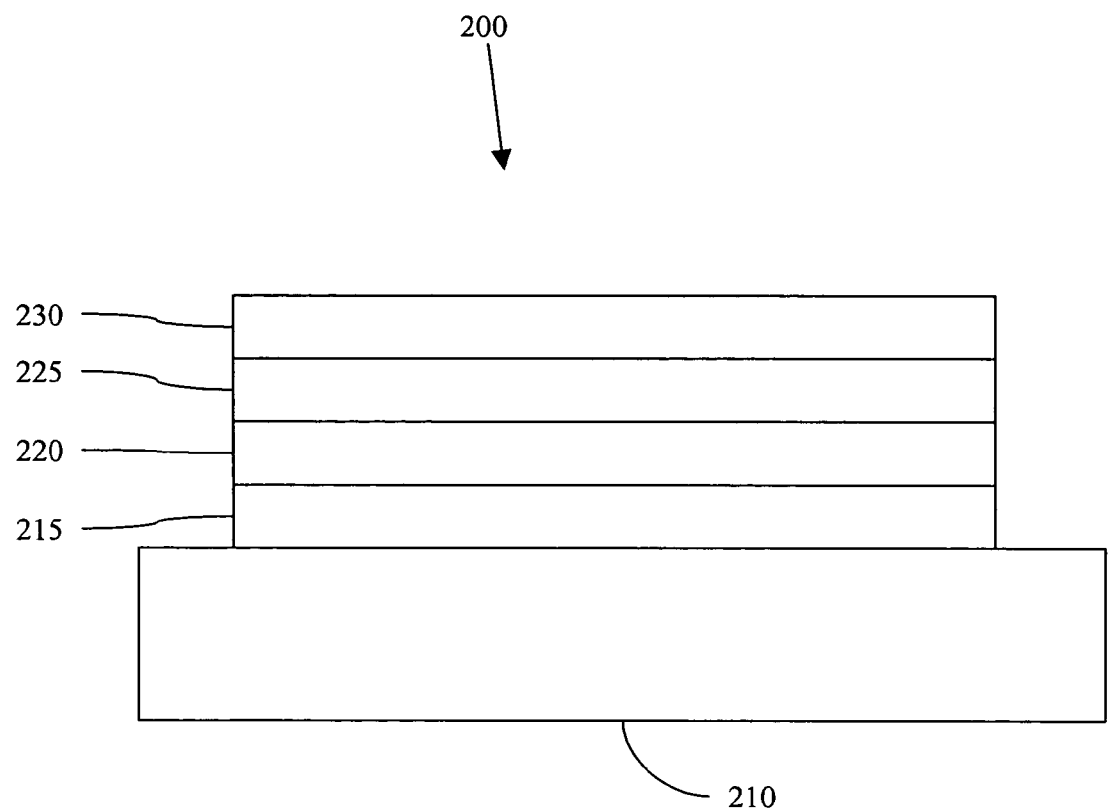
FIG. 2 shows an inverted organic light emitting device that does not have a separate electron transport layer.
Figure 3:
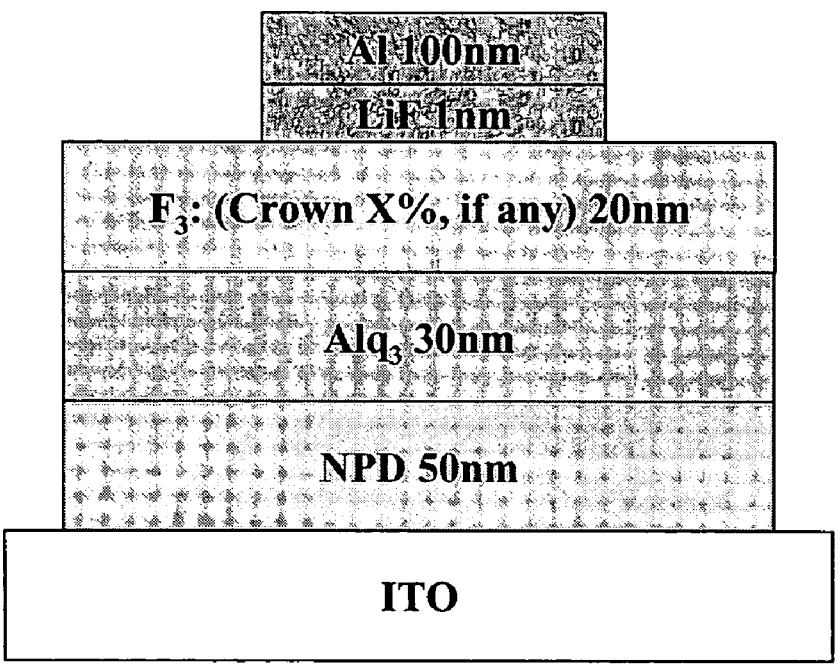
FIG. 3 shows an OLED according to an embodiment of the invention having a device structure ITO/NPD(50 nm)/Alq3 (30 nm)/$F_3$: X % DBC (20 nm)/LiF (1 nm)/Al (10 nm).

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

In a preferred embodiment, the devices of the invention comprise an anode, a cathode, an emissive layer disposed between the anode and the cathode, and an electron transport layer disposed between the emissive layer and the cathode. The electron transport layer comprises an electron transporting host material, an alkali metal or an alkaline earth metal, and a metal binding agent. The emissive layer may emit by fluorescence or phosphorescence, however phosphorescent emission is preferred. Representative emissive layers include doped or un-doped layers comprising phosphorescent organometallic materials such as disclosed in U.S. Pat. Nos. 6,303,238 and 6,310,360; and U.S. Patent Application Publication Nos. 2002-0034656; 2002-0182441; and 2003-0072964; and WO-02/074015.

Having a high carrier mobility does not ensure that a given material will have a high conductivity, as the conductivity is related to the product of the carrier mobility and the number density of free carriers ($\sigma=qN\mu$, where q=electron charge, N=the number density of carriers and $\mu$ is the mobility). Many amorphous organic materials have carrier mobilities of about $10^{-6}$ to $10^{-5}$ cm$^2$/V-sec. A mobility of at least about $10^{-5}$ cm$^2$/V-sec may be considered "high" in this context, although the mobility is preferably at least about $10^{-3}$ cm$^2$/V-sec, and more preferably at least about 0.01 cm$^2$/V-sec. But, embodiments of the invention may be used to improve the conductivity of a layer regardless of carrier mobility.

In organic materials and metal complexes the number of charge carriers may be very low, significantly limiting the conductivity. A practical solution to this problem involves doping the film with redox active dopants, leading to controlled oxidation or reduction of the carrier transporter, creating a finite density of charge carriers. n-Type dopants may be used to increase the electron conductivity of organic and metal complex thin films. The energy requirement for an oxidative redox dopant is that its oxidation potential be below that of the charge carrier's reduction potential. Most common electron transporters have reduction potentials more negative than −1.5 V (versus SHE), making the best choices of reductive (n-type) dopants air sensitive materials. Most deposition tools are not designed to allow the sources to be charged under anaerobic conditions, so an air sensitive dopant may be at least partly oxidized in loading the source cells. The alkali metals and alkaline earth metals can be used as redox dopants, because the oxidation products are non-volatile. Thus, some of the dopant is lost to aerobic oxidation in charging the source, but the metal oxide is stable and does not get evaporated into the film.

There are two potential drawbacks of doping with an alkali metal or alkaline earth metal. The number of free carriers generated by the metal doping is far less than the amount of metal that is doped into the film. The low yield of free carriers may be due to the formation of charge transfer complexes, or tightly bound ion pairs. Additionally, the metal may be highly mobile, readily diffusing throughout a device. Diffusion into layers that are not meant to be redox doped may lead to marked degradation of device performance due to the formation of trapping or quenching sites.

In the present invention, the n-type dopant comprises an alkali metal or an alkaline earth metal cation. In a preferred embodiment, metal is an alkali metal, with lithium being particularly preferred. In order to overcome the problems of diffusion and low carrier yield, the alkali metal or an alkaline earth metal is bound to a metal binding agent.

The metal binding agent coordinates to alkali or alkaline earth metals and inhibits diffusion of the metal out of the doped region. The metal binding agent may also shield the charge of the alkali or alkaline earth metal, decreasing the charge transfer or electrostatic interactions that may lead to inefficient free carrier generation. Using the metal binding agent it is possible to dope a small region of a layer (for example, an electron transport layer) and to keep the doping localized in that region. The metal binding agents are multi-dentate ligands that bind to the alkali or alkaline earth metals. The metal binding agent comprises three or more binding sites held together by covalent bonds. The metal binding agent may further comprise additional chemical components, such as compatibilizers, which are designed to make the metal binding agent more compatible with the matrix (e.g. the electron transport layer material). By being more compatible, it is meant that the metal binding agent may be readily dispersed in the matrix and does not cluster or crystallize extensively. As an example of such a compatibilizing component, a carbaozole group could be added to the periphery of the binding agent to make it more compatible with a carbazole containing matrix, such as CBP or mCP. It is preferred that the metal binding agent be electrically neutral and not participate in the carrier conduction. In preferred embodiments, the metal binding agent binds to the alkali or alkaline earth metal with an enthalpy of binding of at least about 10 kilojoules/mole. More preferably the metal binding agent binds to the alkali or alkaline earth metal with an enthalpy of binding of at least about 17 kilojoules/mole, and still more preferably with an enthalpy of binding of at least about 21 kilojoules/mole. The enthalpy of binding may be measured in solution as this measurement is proportional to the enthalpy of binding in the solid state.

Preferred metal binding agents comprise the crowns, cryptands, and derivatives thereof. Preferred crowns are macrocyclic compounds have repeating units of —CR$_2$—CR$_2$—X—, wherein each R is independently selected from H, alkyl, aryl, and aralkyl or the R's on adjacent carbons may form a double bond or may be involved in a fused cyclic group, and each X is independently selected from O, S, and NR. In one embodiment, two or more metal binding agents are linked together through an R group. Particularly preferred crowns include macrocyclic polyethers containing repeating units of —CR$_2$—CR$_2$—O—, commonly known as crown ethers. Representative crown ethers are shown below:

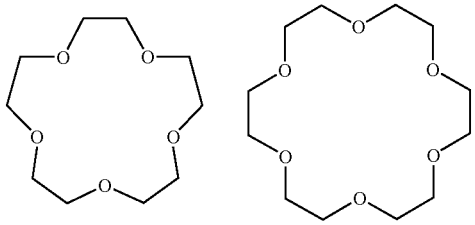

Cryptands are compounds comprising a bicyclic or polycyclic assembly of binding sites which defines a cavity in such a way as to bind to the alkali or alkaline earth metal. A representative cryptand is shown below:

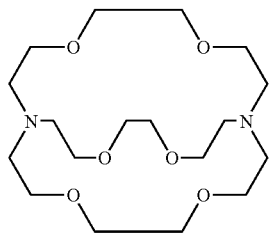

The metal binding agent may be a derivatized. For example, the crown ether may be incorporated into a polymer backbone. One or more of the oxygens of the crown ether or cryptand may be substituted by a nitrogen or a sulfur. In a preferred embodiment, two or more metal binding agents may be linked together, for example by an alkyl or aryl linking group. Preferred crown ethers which incorporate phenyl linking groups are shown below:

In preferred embodiments, the metal binding agent will be processable into the device by deposition using thermal evaporation. The sublimation conditions of the metal binding agent may be adjusted to a useful range by the chemical modification of the metal binding agent. For example, one or more substituents may be added to a crown or cryptand to increase the sublimation temperature.

In addition to the metal binding portion (crown, cryptand, etc.), the metal binding agent may further comprise a compatibilizer. As used herein, the term "compatibilizer" refers to a chemical entity, such as molecule, oligomer or polymer, designed to match the host material into which the metal binding agent is being doped. Thus, the metal binding agent may be substituted with a chemical group that matches one or more chemical properties of the host material. For example, if the host comprises a non-polar material, the metal binding agent may be substituted with one or more non-polar alkyl or aryl groups. The compatibilizer may be selected from a chemical group that is similar to a group found in the host material. For example, if the host material comprises CBP or mCP, a compatibilizer comprising a carbazole group may be used as a substituent on the metal binding agent. Metal binding agents that comprise a compatibilizer may avoid phase separation and aggregation when doped into a host matrix. Representative metal binding agents comprising a compatibilizer are depicted below:

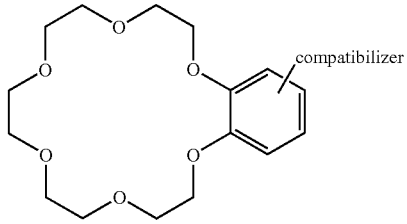

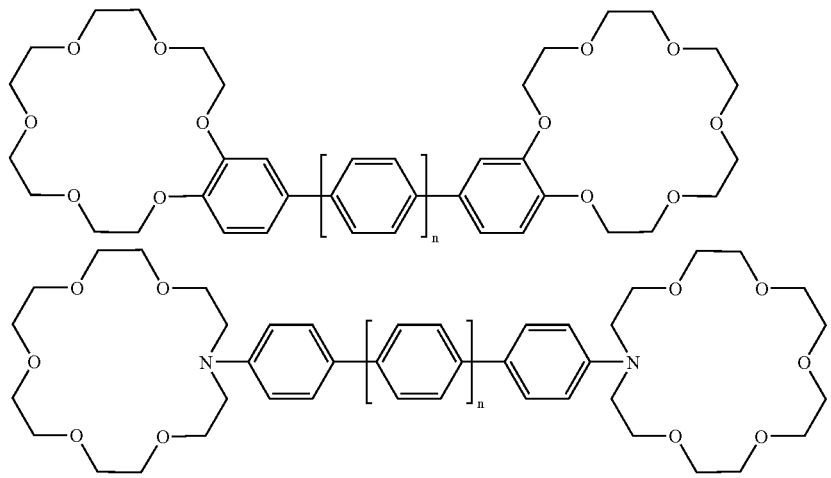

wherein n is 0 to 8.

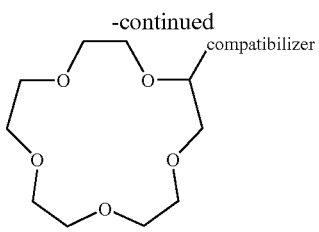
compatibilizer

The host material for the n-type dopant may be a conventional ETL host material, such as BCP, Alq$_3$, oxidiazoles, triazoles, phenanthrolines, etc. In addition, other materials have been reported which have high a electron mobility, but have do not make effective electron transporting layer materials. One such set of materials is oligofluorenes. OLEDs prepared with oligofluorene ETLs give high turn on voltages and low efficiencies. These materials have electron mobilities higher than conventional ETL materials such as Alq$_3$ (e.g. $\mu$ (Alq$_3$)=$10^{-5}$ cm$^2$V-sec while $\mu$ (fluorine dimmer)=$10^{-3}$ cm$^2$ N-sec). However, materials such as oligofluorenes are not readily doped by alkali or alkaline earth metal ions, such as Li ions. The problem is that without heteroatoms to coordinate the alkali or alkaline earth metal ions, there is nothing to stabilize the metal cations formed on doping the ETL. The isolated metal cations, in this non-coordinating matrix, may be very unstable. The end result is that the neat oligofluorene film is not effectively doped with the alkali or alkaline earth metal alone, and remains fairly insulating. The same argument can be made for a polyaromatic ETLs, such as SC5, P4N and others. By using a metal binding agent doped into the organic layer, the alkali or alkaline earth metal may be rendered compatible with the doped layer. The complex formed by the metal binding agent and the alkali or alkaline earth metal may be compatible with the ETL material (for example, oligofluorene, SC5, P4N, etc.) when the alkali or alkaline earth metal alone would not be compatible.

Thus, in a embodiment of the invention, the host material for the n-type dopant is a polyaromatic compound, such as oligofluorenes, SC5, P4N, and the like. Preferred host materials include oligofluorenes having the formula

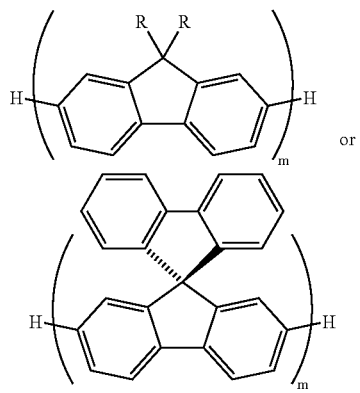

wherein m is 2 to 8 and each R is independently selected from alkyl, aryl and aralkyl.

In a preferred embodiment of the invention, the complex of the alkali metal or alkaline earth metal and the metal binding agent may be doped into an organic layer that is disposed between the emissive layer and the cathode. In this embodiment the layer containing the alkali metal or alkaline earth metal and the metal binding agent may be an electron transport layer, a blocking layer, or may combine these properties. In a further preferred embodiment, the alkali metal or alkaline earth metal and the metal binding agent are doped into a portion of an organic layer that is disposed between the emissive layer and the cathode. For example, an organic layer adjacent to the emissive layer may be comprised of two sublayers. The sublayer nearer to the emissive layer may comprise a host material and the sublayer farther from the emissive layer may comprise the alkali metal or alkaline earth metal and the metal binding agent doped into the host material. The metal binding agent may serve to confine the alkali or alkaline earth metal to the doped sublayer. In a further embodiment, the electron transport layer is comprised of two sublayers. The first sublayer is in physical contact with the emissive layer and is not doped with a metal binding agent. The second sublayer is on the cathode-side of the electron transport layer and comprises the metal binding agent and the alkali metal or alkaline earth metal. In this embodiment, the electron transport layer may combine the functions of electron transport and blocking, mitigating the need for additional blocking layers.

It is preferred that the concentration of the metal binding agent in the doped region be at least about equal to the concentration of the alkali metal or alkaline earth metal. In a preferred embodiment, the metal binding agent is doped into a host material at a concentration of about 4% to about 50%, and more preferably at a concentration of about 5% to about 25%.

In another embodiment of the invention, the metal binding agent or the complex of the alkali metal or alkaline earth metal and the metal binding agent may be doped into an emissive layer. In one embodiment, the metal binding agent or the complex of the alkali metal or alkaline earth metal and the metal binding agent may be used as an emissive material. When used as an emissive material, the metal binding agent has as a substituent one or more fused aryl groups or pendant aryl groups. For example, the crown ether, dibenzo-18-crown-6, is emissive, giving a fluorescence $\lambda_{max}$ of roughly 300 nm and a phosphorescence $\lambda_{max}$ of roughly 480 nm. [Haruo Shizuka, Klyoshl Takada, and Toshifuml Morlta, "Fluorescence Enhancement of Dibenzo-I 8-crown-6 by Alkali Metal Cations", *J. Phys. Chem.* 1980, 84, 994–999]. However, the phosphorescence occurs only at very low temperature (i.e., at liquid nitrogen temperatures), as is the case for most phosphorescent organic materials other than the transition-metal-containing, organometallic phosphorescent materials such as discussed above. Coordination of alkali metals to the crown increases the efficiency of both fluorescence and phosphorescence. The emission here likely originates from the ortho-dialkoxyphenyl groups of the dibenzo-crown.

In another embodiment of the invention, the metal binding agent or the complex of the alkali metal or alkaline earth metal and the metal binding agent may also be used as host materials for phosphorescent or fluorescent emissive dopants.

The organic layer comprising the alkali or alkaline earth metal and the metal binding agent may be fabricated by either co-depositing the metal, metal binding agent and, optionally, a host material or by depositing the alkali or alkaline earth metal onto the organic layer and relying on diffusion of the metal into the organic layer. In a preferred embodiment, an organic layer comprising the alkali or alkaline earth metal and the metal binding agent is fabricated by co-depositing a host material and the metal binding agent. A layer comprising the alkali metal or alkaline earth metal is deposited adjacent to this organic layer. The alkali metal or alkaline earth metal diffuses into the adjacent organic layer and is bound by the metal binding agent. The alkali or alkaline earth metal may be deposited as the metal or as a metal salt. Preferred metal salts include the alkali metal halides and the alkaline earth metal halides.

In a further preferred embodiment, after the device is fabricated it is thermally annealed. The annealing step may function by allowing the metal binding agent to more effectively bind to the alkali or alkaline earth metal. Without being limited by theory, the metal binding agent may not be in a conformation best suited for metal binding upon deposition. The thermal annealing process may allow the metal binding agent to change conformations, thereby allowing the metal binding agent to bind more strongly to the alkali or alkaline earth metal. Thus, thermal annealing of the device may increase the efficiency of the metal binding agent in confining the alkali or alkaline earth metal to a specific region of the device.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted with one or more substituents selected from halo, CN, O-alkyl, and aryl.

The term "alkenyl" as used herein contemplates both straight and branched chain alkene radicals. Preferred alkenyl groups are those containing two to fifteen carbon atoms. Additionally, the alkyl group may be optionally substituted with one or more substituents selected from halo, CN, O-alkyl, and aryl.

The term "aralkyl" as used herein contemplates an alkyl group which has as a substituent an aromatic group. Additionally, the aralkyl group may be optionally substituted on the aryl with one or more substituents selected from halo, CN, O-alkyl, and aryl.

The term "aryl" or "aromatic group" as used herein contemplates single-ring and polycyclic aromatic groups, including substituted or unsubstituted phenyl, substituted or unsubstituted naphthyl, and aromatic heterocyclic groups such as substituted or unsubstituted pyridine, pyrimidine and the like. Additionally, the aromatic group may be optionally substituted with one or more alkyl, alkenyl, alkoxy, aryl, aralkyl, halogen, and CN.

The term "halo" or "halogen" as used herein includes fluorine, chlorine, bromine and iodine. The term "halide" refers to the respective anions.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:
CBP: 4,4'-N,N-dicarbazole-biphenyl
m-MTDATA 4,4',4''-tris(3-methylphenylphenlyamino)triphenylamine
Alq$_3$: 8-tris-hydroxyquinoline aluminum
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(Ppy)$_3$: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-quinolinato)$_4$-phenylphenylate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
Ir(4,6-F$_2$ ppy)$_2$(BPz$_4$) iridium(III) bis(2-(4,6-difluorphenyl) pyridinato-N, C$^2$)η$^2$-N,N'-(tetrakis(1-pyrazolyl)borate)
p-(SiPh$_3$)$_2$Ph p-bis(triphenylsilyl)benzene
DBC dibenzo-18-crown-6
F$_3$ 2,2':7',2''-Ter-9dimethyl-fluorene
SC5 2,4,6-triphenyl-1-biphenyl-benzene
P4N 1,2,3,4-tetraphenylnapthalene

EXPERIMENTAL

Specific representative embodiments of the invention will now be described, including how such embodiments may be made. It is understood that the specific methods, materials, conditions, process parameters, apparatus and the like do not necessarily limit the scope of the invention.

EXAMPLE 1

Two devices were prepared, ITO/NPD (500 Å)/Alq$_3$ (300 Å)/F$_3$ (200 Å)/Li (10 Å)/Al (1000 Å) and ITO/NPD (500 Å)/Alq$_3$ (300 Å)/F$_3$+15% DBC (200 Å)/Li (10 Å)/Al(1000 Å). The organic light emitting devices were grown on a glass substrate pre-coated with a ~100-nm thick layer of indium-tin-oxide (ITO) having a sheet resistance of ~20 Ω/□. Substrates were cleaned with solvents and then cleaned by exposure to UV-ozone ambient for 10 minutes. After cleaning, the substrates were immediately loaded into a thermal evaporation system operating at a base pressure of ~1×10$^{-6}$ Torr. A 500-Å-thick 4–4'-bis[N-(1-naphthyl)-N-phenyl-amino]biphenyl (α-NPD) hole transport layer (HTL) was deposited. Next, a 300-Å-thick aluminum (III) tris (8-hydroxyquinoline) (Alq$_3$) as emitting material was deposited. Dibenzo-18-crown-6 (15% by weight) was co-deposited with fluorene trimer (F$_3$) to form the 300-Å-thick electron transport layer (ETL) and in the reference device only F$_3$ was deposited as ETL. Device cathodes consisting of a 10-Å-thick layer of Li followed by a 1000-Å-thick layer of aluminum were deposited through a shadow mask. The devices active area was 2×2 mm$^2$.

Figure 4:
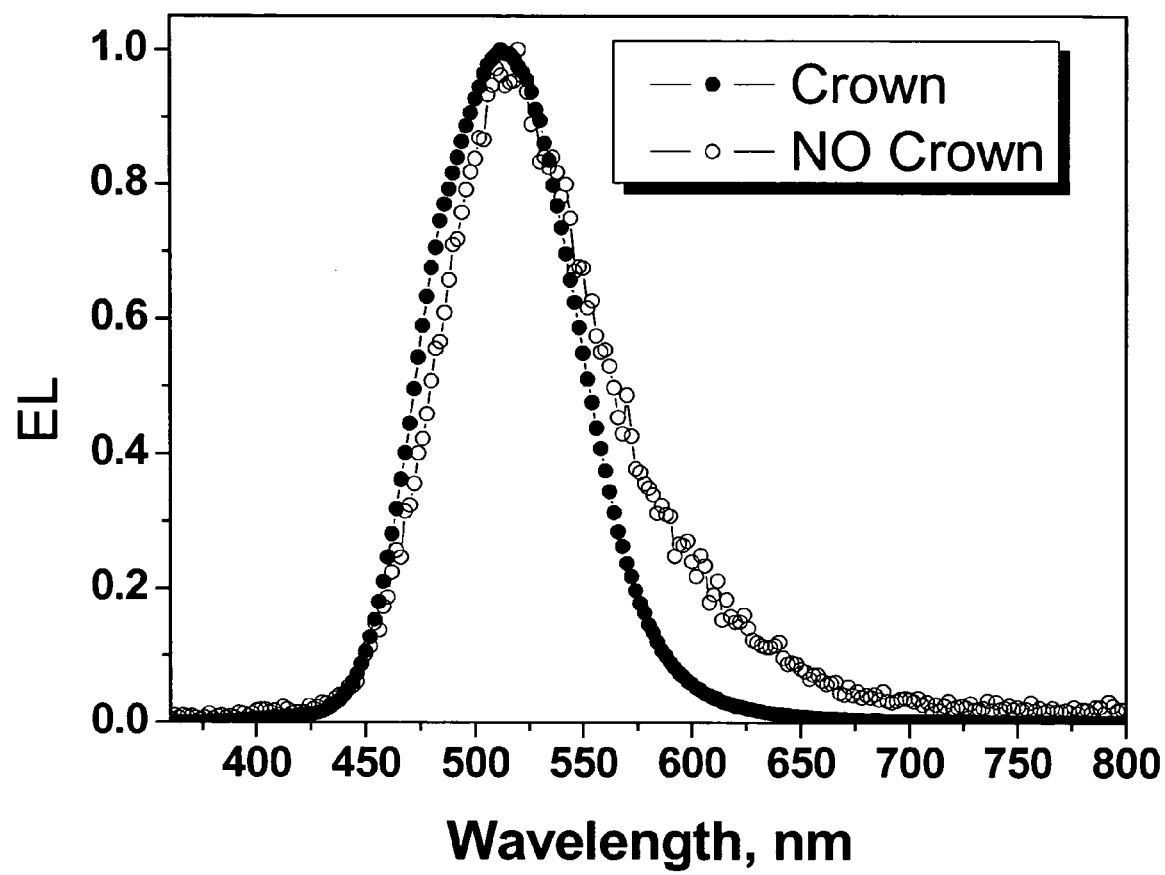
FIG. 4 shows the electroluminescent spectra for devices having the structure ITO/NPD(50 nm)/Alq3 (30 nm)/$F_3$: X % DBC (20 nm)/Li (1 nm)/Al (100 nm), in which the ETL is (i) $F_3$, or (ii) 15% DBC in $F_3$.
Figure 5:
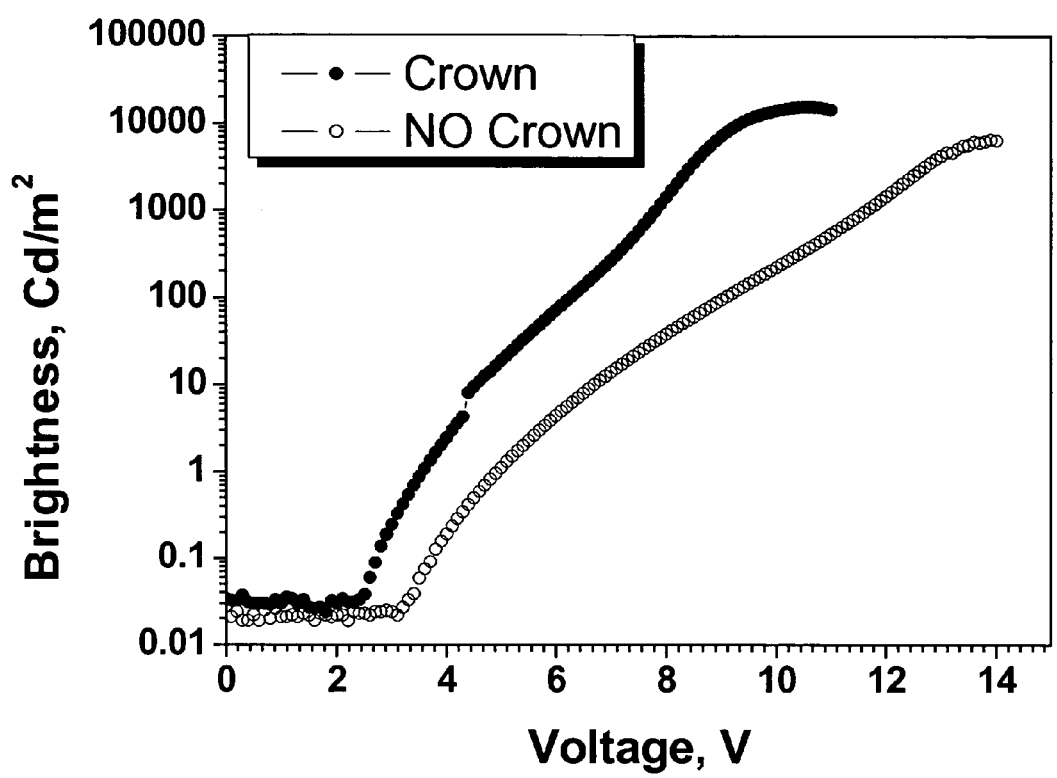
FIG. 5 shows the plot of brightness vs voltage for devices having the structure ITO/NPD(50 nm)/Alq3 (30 nm)/$F_3$: X % DBC (20 nm)/Li (1 nm)/Al (100 nm), in which the ETL is (i) $F_3$, or (ii) 15% DBC in $F_3$.
Figure 6:
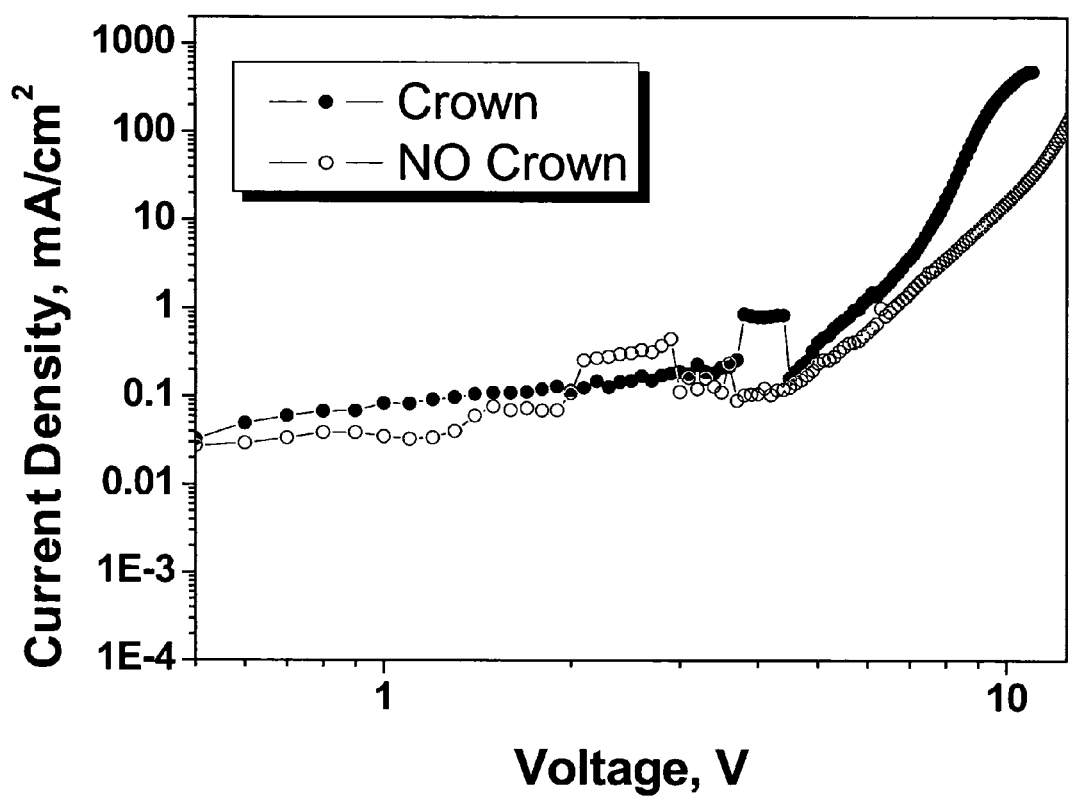
FIG. 6 shows the plot of current density vs voltage for devices having the structure ITO/NPD(50 nm)/Alq3 (30 nm)/$F_3$: X % DBC (20 nm)/Li (1 nm)/Al (100 nm), in which the ETL is (i) $F_3$, or (ii) 15% DBC in $F_3$.
Figure 7:
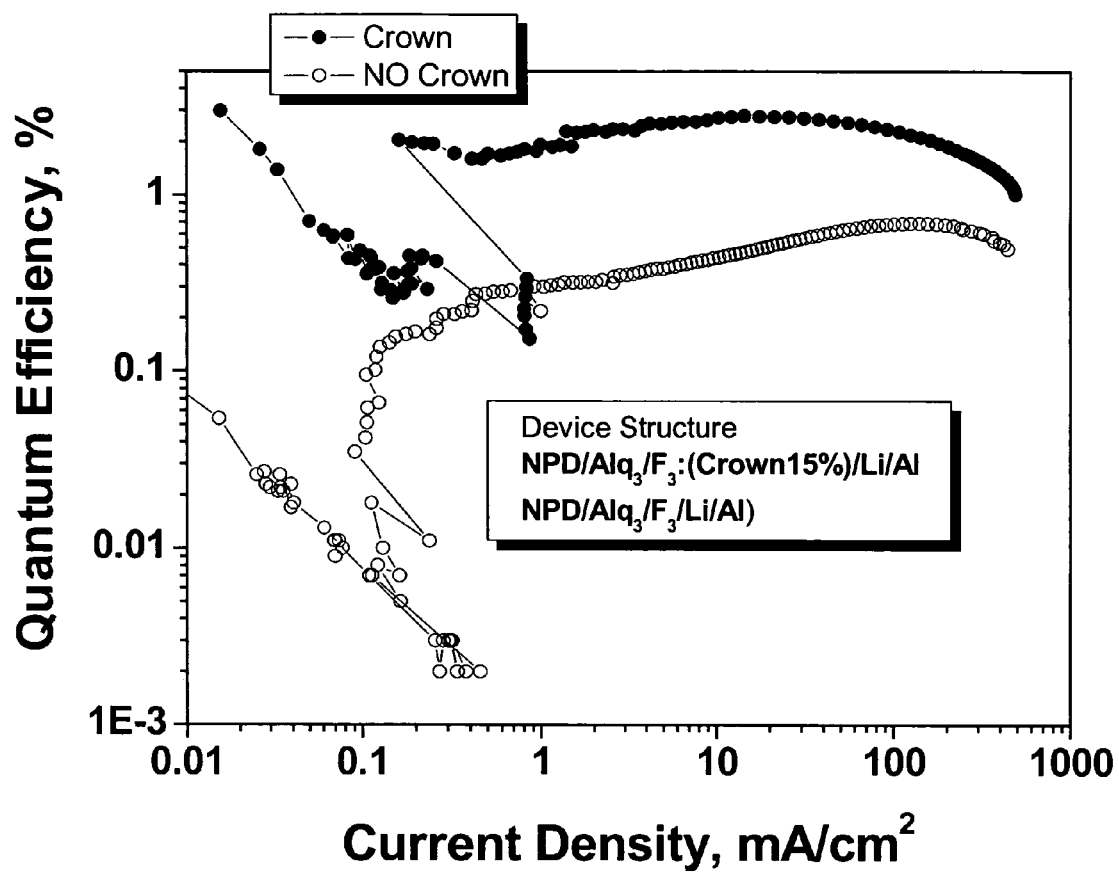
FIG. 7 shows the plot of quantum efficiency vs current density for devices having the structure ITO/NPD(50 nm)/Alq3 (30 nm)/$F_3$: X % DBC (20 nm)/Li (1 nm)/Al (100 nm), in which the ETL is (i) $F_3$, or (ii) 15% DBC in $F_3$.

Data for the two devices (One with an undoped trifluorene and one with 15% dibenzocrown doped into the trifluorene) are shown in FIGS. 4–7. Both devices emit from the Alq$_3$ layers. While alkali doped crown ethers may luminesce, the fluorescence and phosphorescence energies are typically high, at 300 and 490 nm, respectively dibenzo-18-crown-6 ("Fluorescence Enhancement of Dibenzo-18-crown-6 by Alkali Metal Cations", H. Shizuka, K. Takada, T. Morita, *J. Phys. Chem.*, 1980, 84, 994–999). Neither of these emission lines is observed in the EL spectra (FIG. 4). The current levels in the DBC doped device are higher than those of the undoped $F_3$ based devices at a given voltage (FIG. 6), indicating that the device was more efficient with the crown than without it. The efficiency of the crown doped device is greater than the undoped device (FIG. 7).

The increased efficiency observed for the $F_3$:DBC based device is also consistent with greater $F_3$ doping for the $F_3$-DBC based device. A simple NPD/Alq$_3$ based device is electron deficient, i.e. the hole current is greater than the electron current. Increasing the conductivity of the $F_3$ doped layer will increase the electron conduction and thus the electron balance. The enhanced doping leads to higher electron conductivity and lowers the electron injection barrier at the ETL/cathode interface. Both of these factors will work to improve the carrier balance by increasing the electron current.

EXAMPLE 2

Devices were prepared having the structure ITO/NPD (500 Å)/Alq$_3$ (300 Å)/F$_3$ (200 Å)/Li (10 Å)/Al (1000 Å) and ITO/NPD (500 Å)/Alq$_3$ (300 Å)/ETL (200 Å)/Li(10 Å)Al (1000 Å), in which ETL is (i) 5% DBC in $F_3$, (ii) 15% DBC in $F_3$, (iii) 25% DBC in $F_3$, or (iv) $F_3$ alone. Organic light emitting devices were grown on a glass substrate pre-coated with a ~100-nm thick layer of indium-tin-oxide (ITO) having a sheet resistance of ~20 Ω/□. Substrates were cleaned with solvents and then cleaned by exposure to UV-ozone ambient for 10 minutes. After cleaning, the substrates were immediately loaded into a thermal evaporation system operating at a base pressure of ~1×10$^{-6}$ Torr. A 500-Å-thick 4–4'-bis[N-(1-naphthyl)-N-phenyl-amino]biphenyl (α-NPD) hole transport layer (HTL) was deposited. Next, a 300-Å-thick aluminum (III) tris (8-hydroxyquinoline) (Alq$_3$) as emitting material was deposited. In three separate devices, a 300-Å-thick electron transport layer (ETL), consisting of X % (X %=5%, 15% and 25% respectively) dibenzo-18-crown-6 (by weight) was co-deposited with $F_3$. Device cathodes consisting of a 10-Å-thick layer of LiF followed by a 1000-Å-thick layer of aluminum were deposited through a shadow mask. The devices active area was 2×2 mm$^2$.

Figure 8:
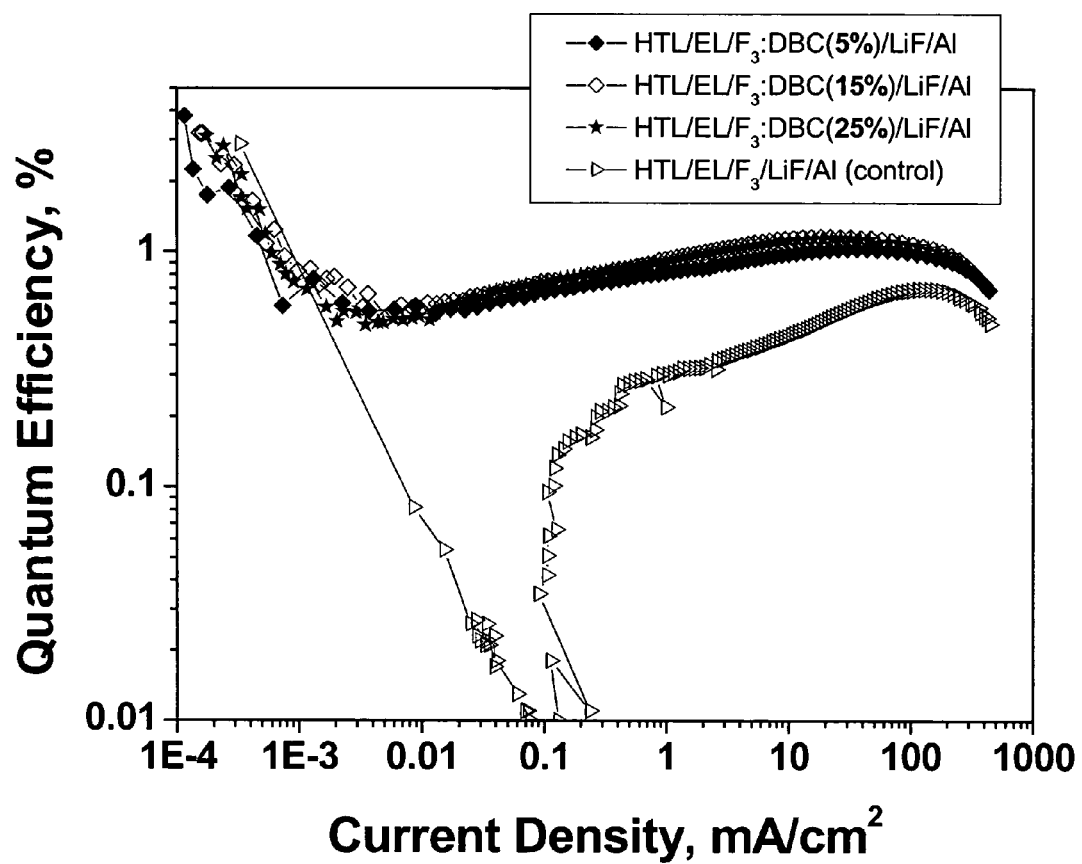
FIG. 8 shows the plot of quantum efficiency vs current density for devices having the structure ITO/NPD(50 nm)/Alq3 (30 nm)/ETL (20 nm)/LiF (1 nm)/Al (100 nm), in which the ETL is (i) 5% DBC in $F_3$, (ii) 15% DBC in $F_3$, (iii) 25% DBC in $F_3$, or (iv) $F_3$ alone.
Figure 9:
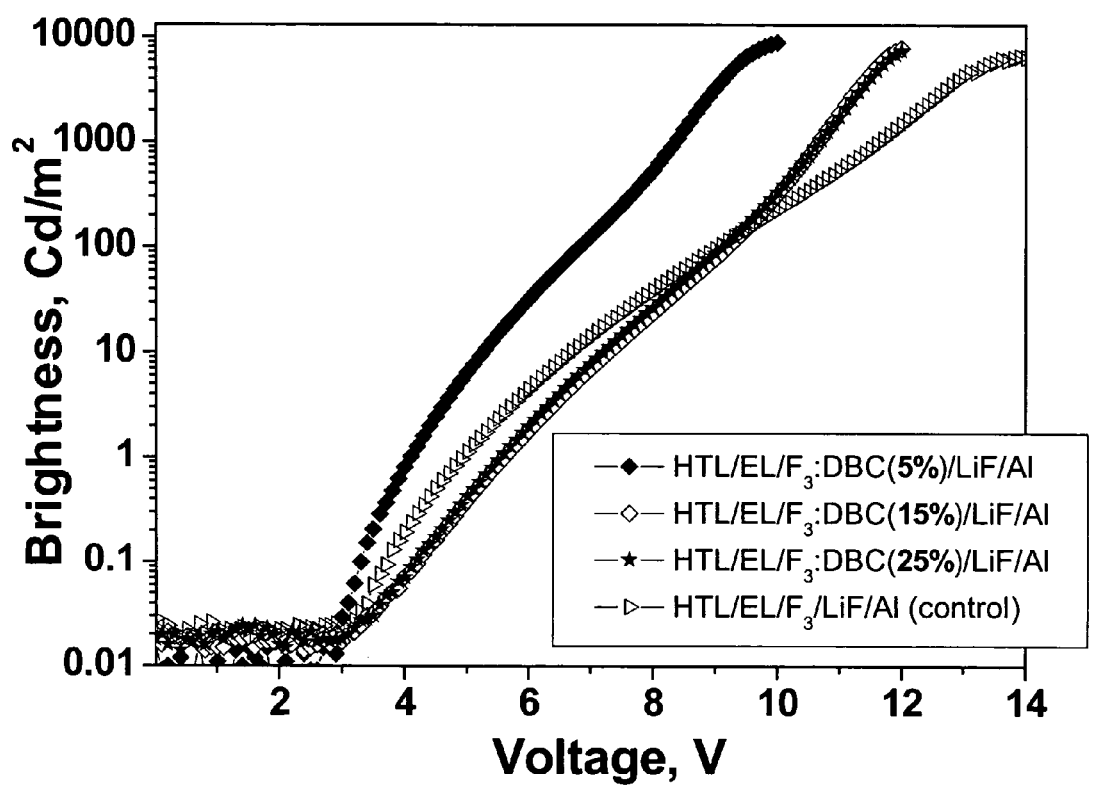
FIG. 9 shows the plot of brightness vs voltage for devices having the structure ITO/NPD(50 nm)/Alq3 (30 nm)/ETL (20 nm)/LiF (1 nm)/Al (100 nm), in which the ETL is (i) 5% DBC in $F_3$, (ii) 15% DBC in $F_3$, (iii) 25% DBC in $F_3$, or (iv) $F_3$ alone.
Figure 10:
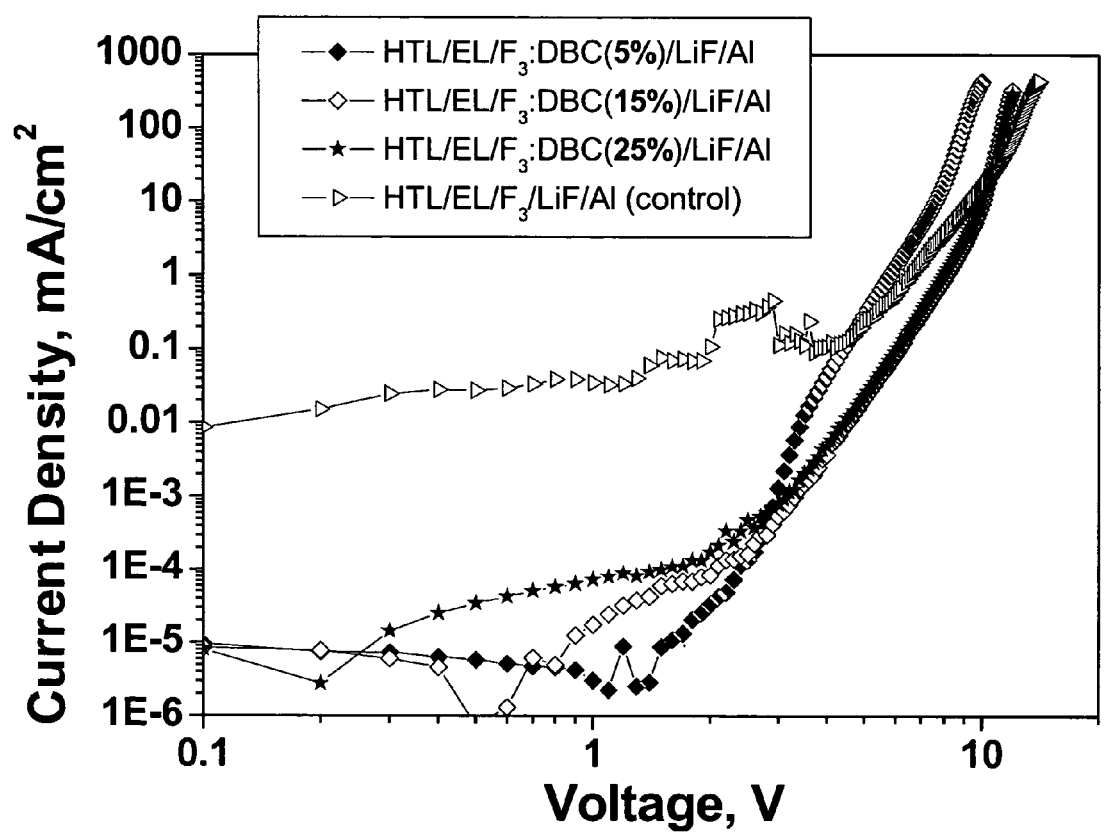
FIG. 10 shows the plot of current density vs voltage for devices having the structure ITO/NPD(50 nm)/Alq3 (30 nm)/ETL (20 nm)/LiF (1 nm)/Al (100 nm), in which the ETL is (i) 5% DBC in $F_3$, (ii) 15% DBC in $F_3$, (iii) 25% DBC in $F_3$, or (iv) $F_3$ alone.
Figure 11:
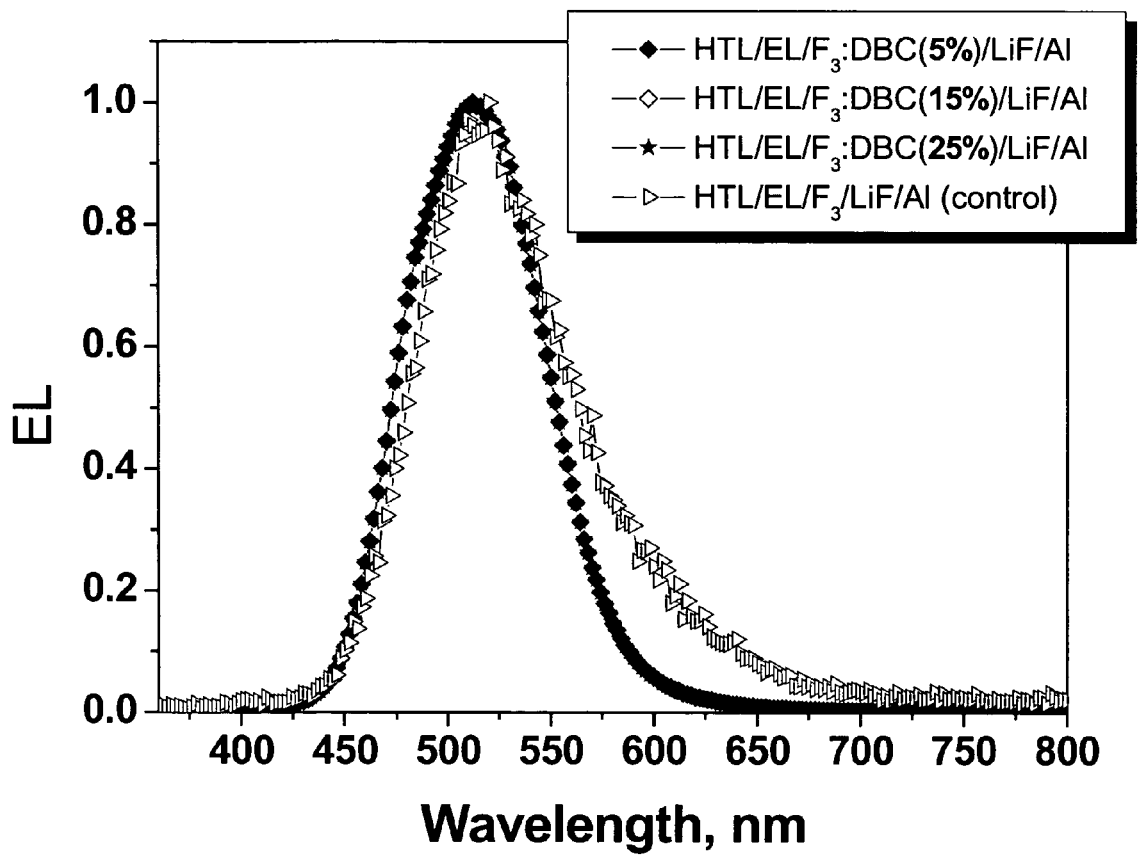
FIG. 11 shows the electroluminescent spectra for devices having the structure ITO/NPD(50 nm)/Alq3 (30 nm)/ETL (20 nm)/LiF (1 nm)/Al (100 nm), in which the ETL is (i) 5% DBC in $F_3$, (ii) 15% DBC in $F_3$, (iii) 25% DBC in $F_3$, or (iv) $F_3$ alone.

Data for the four devices ((i) 5% DBC in $F_3$, (ii) 15% DBC in $F_3$, (iii) 25% DBC in $F_3$, and (iv) $F_3$ alone.) are shown in FIGS. 8–11. The efficiencies of the DBC doped devices (doping level of 5, 15 and 25%) are comparable and all exceed the efficiency of the undoped reference device (FIG. 8). The ETL in these devices as Alq$_3$. Low DBC doping levels (5%) leads to higher brightness at low voltage, however, at higher voltages the doped devices all give higher brightness than the reference device (FIG. 9). The high current at low to moderate voltage levels indicates that carrier leakage in the reference device is far more significant than in the DBC doped devices (FIG. 10). The doped $F_3$ layers in the doped devices lead to efficient electron blocking at low voltage and enhanced carrier conduction and improved carrier balance at moderate and high voltages. The spectra of the $F_3$ doped devices and the reference device are consistent with Alq$_3$ emission (FIG. 11).

EXAMPLE 3

Figure 12:
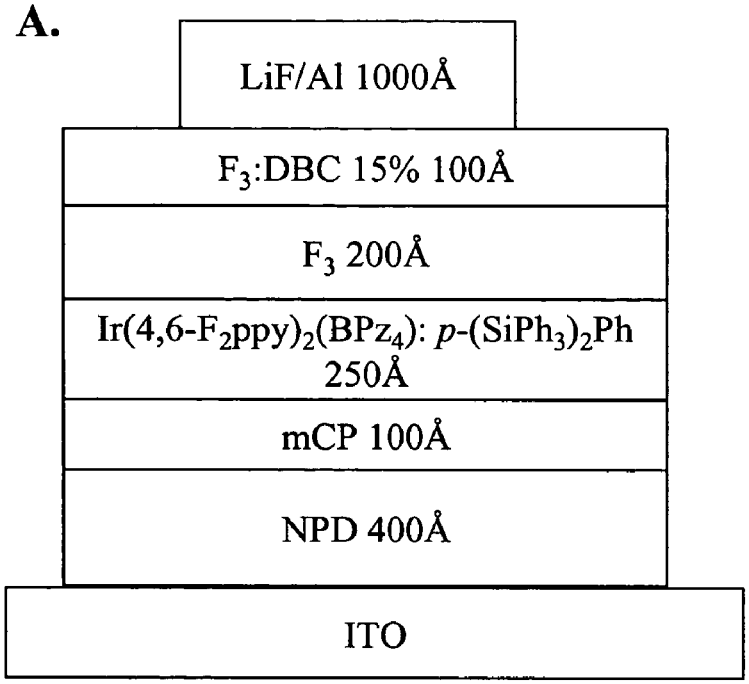
FIG. 12 shows OLEDs according to embodiments of the invention.
Figure 12:
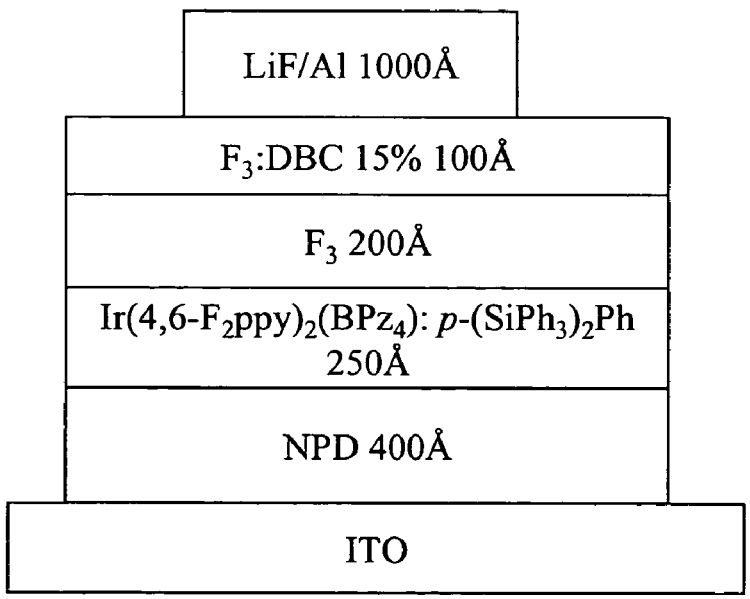
Figure 13:
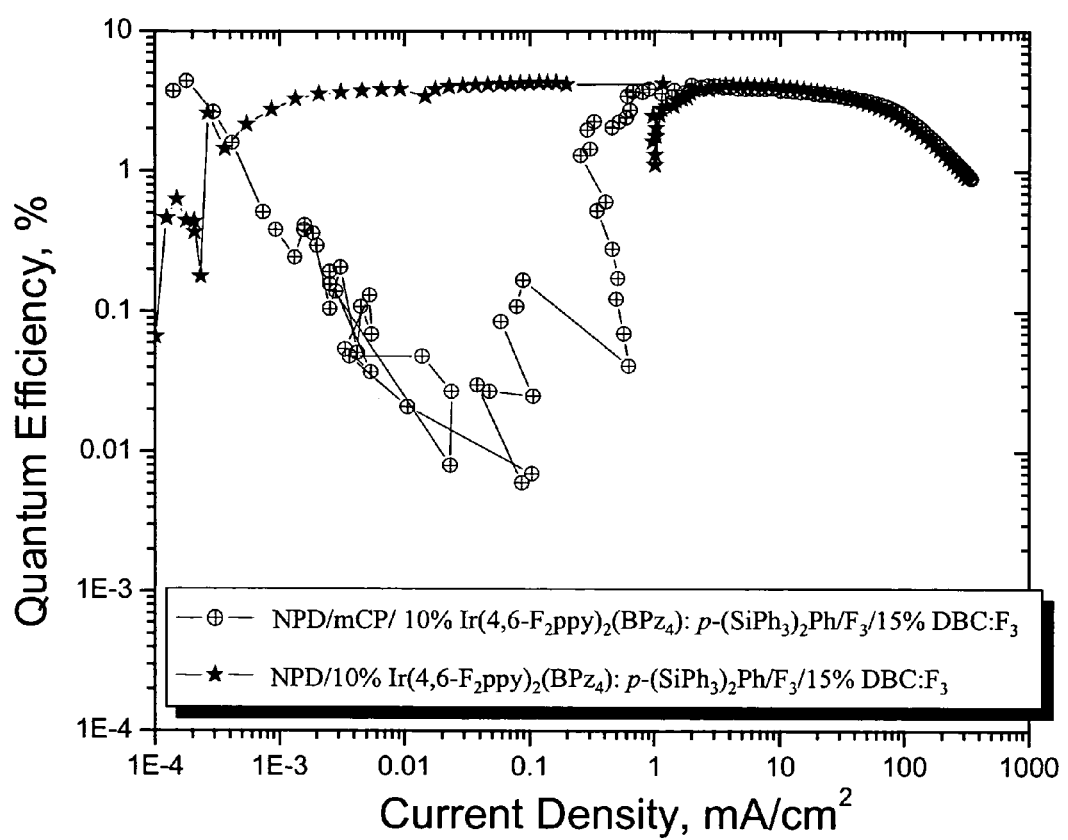
FIG. 13 shows the plot of quantum efficiency vs current density for the devices of FIGS. 12A and 12B.
Figure 14:
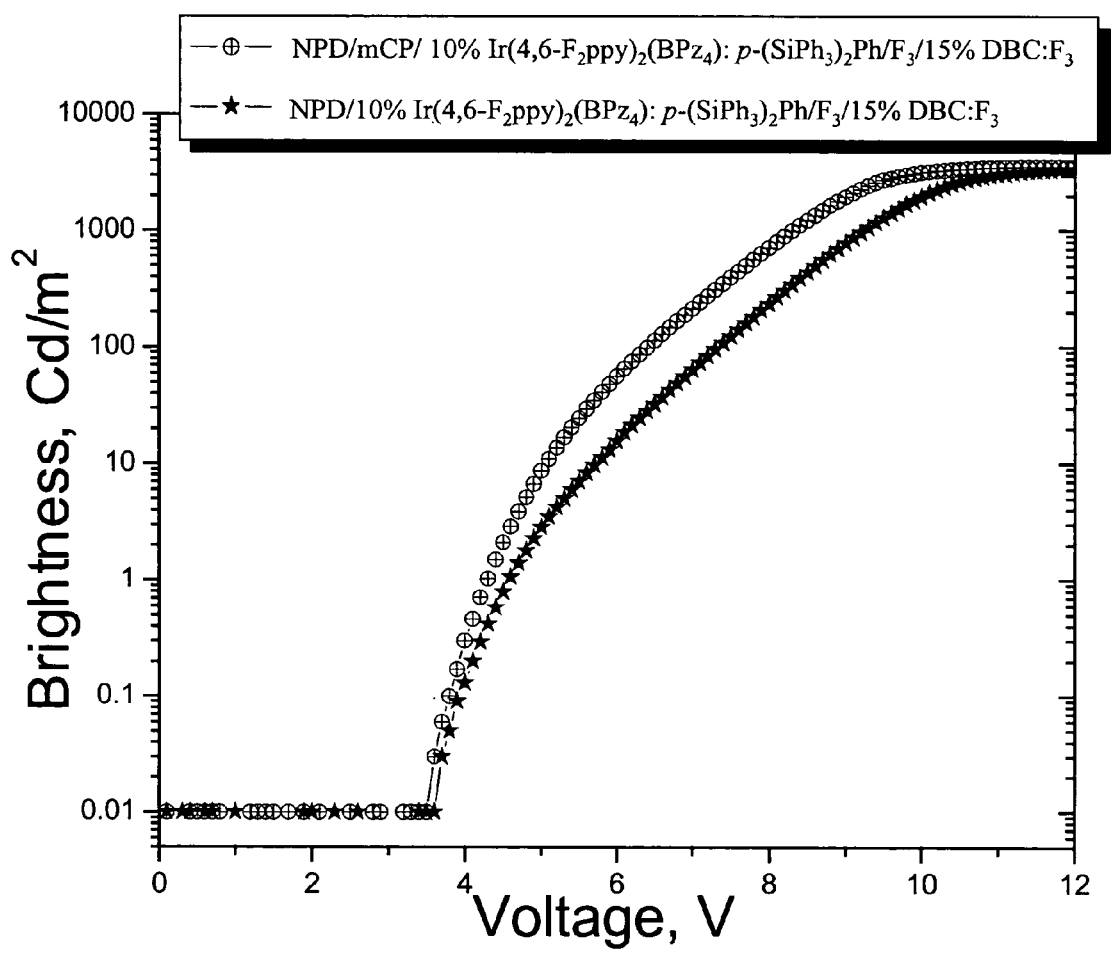
FIG. 14 shows the plot of brightness vs voltage for the devices of FIGS. 12A and 12B.

Devices were prepared having the structures (A) ITO/NPD (400 Å)/mCP(100 Å)/10% Ir(4,6-F$_2$ ppy)$_2$(BPZ$_4$): p-(SiPh$_3$)$_2$Ph (250 Å)/F$_3$ (200 Å)/15% F$_3$:DBC (100 Å)/LiF/Al (1000 Å), and (B) ITO/NPD (400 Å)/10% Ir(4,6-F$_2$ ppy)$_2$(BPZ$_4$): p-(SiPh$_3$)$_2$Ph (250 Å)/F$_3$ (200 Å)/15% F$_3$:DBC (100 Å)/LiF/Al (1000 Å) (FIGS. 12A and 12B). The organic light emitting devices were grown on a glass substrate pre-coated with a ~100-nm thick layer of indium-tin-oxide (ITO) having a sheet resistance of ~20 Ω/□. Substrates were cleaned with solvents and then cleaned by exposure to UV-ozone ambient for 10 minutes. After cleaning, the substrates were immediately loaded into a thermal evaporation system operating at a base pressure of ~1×10$^{-6}$ Torr. A 500-Å-thick 4–4'-bis[N-(1-naphthyl)-N-phenyl-amino]biphenyl (α-NPD) hole transport layer (HTL) was deposited. In one device a 100 Å thick layer of mCP was deposited. Next a 250-Å-thick phosphorescent emissive layer of 10% Ir(4,6-F$_2$ ppy)$_2$(BPZ$_4$) in p-(SiPh$_3$)$_2$Ph (250 Å) was deposited. Next a 200-Å-thick layer of fluorene trimer (F$_3$) was deposited, followed the a layer formed by the co-deposition of dibenzo-18-crown-6 (15% by weight) in fluorene trimer (F$_3$). The device cathodes consisting of a 10-Å-thick layer of Li followed by a 1000-Å-thick layer of aluminum were deposited through a shadow mask.

Figure 15:
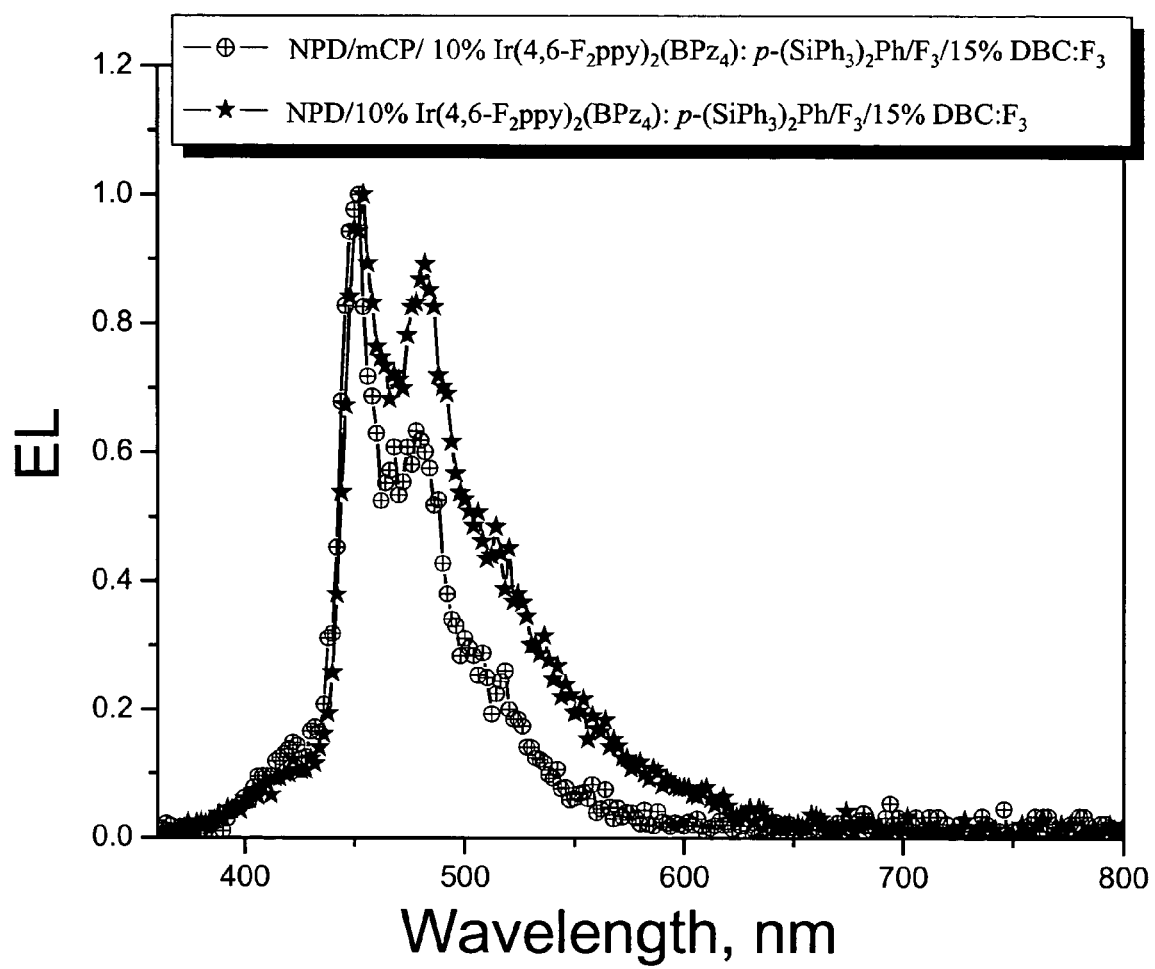
FIG. 15 shows the electroluminescent spectra for the devices of FIGS. 12A and 12B.
Figure 16:
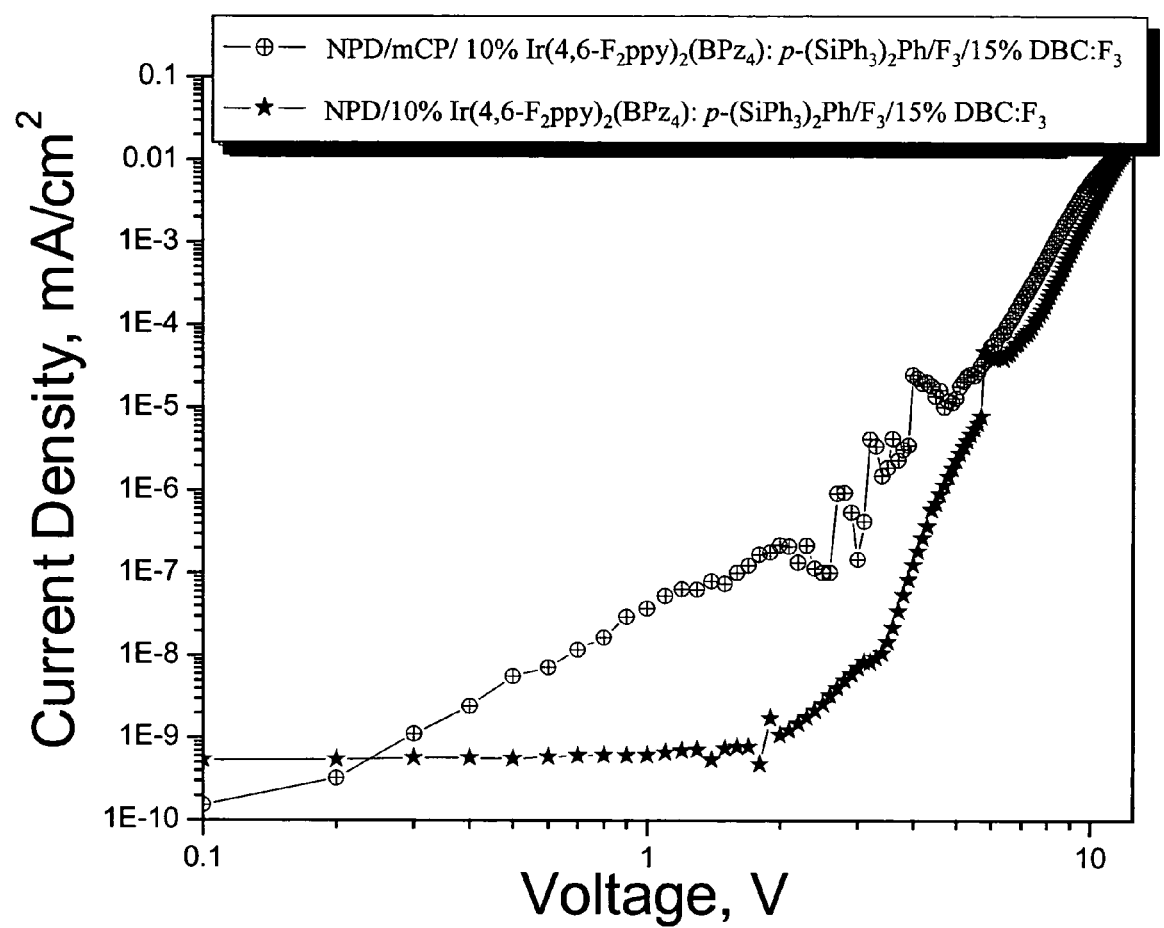
FIG. 16 shows the plot of current density vs voltage for the devices of FIGS. 12A and 12B.
Figure 17:
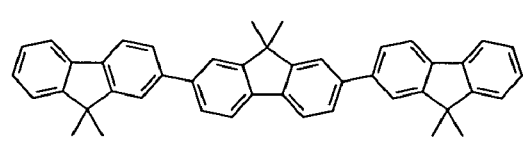
FIG. 17 shows the chemical structures for 2,2':7',2"-Ter-9dimethyl-fluorene ($F_3$), dibenzo-18-crown-6 (DBC), 2,4,6-triphenyl-1-biphenyl-benzene (SC5,) 1,2,3,4-tetraphenyl-napthalene (P4N), iridium(III) bis(2-(4,6-difluorphenyl)pyridinato-N, $C^2$)$\eta^2$-N,N'-(tetrakis(1-pyrazolyl)borate) (Ir (4,6-$F_2$ ppy)$_2$(BPz$_4$)), and p-bis(triphenylsilyl)benzene (p-(SiPh$_3$)$_2$Ph).
Figure 17:
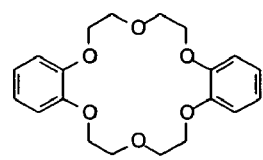
Figure 17:
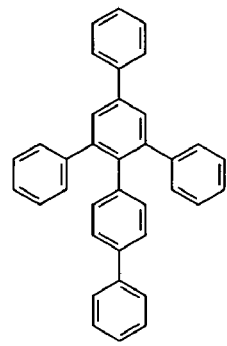
Figure 17:
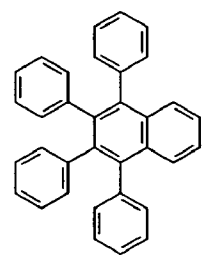
Figure 17:
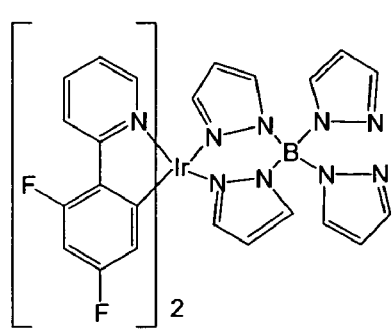
Figure 17:
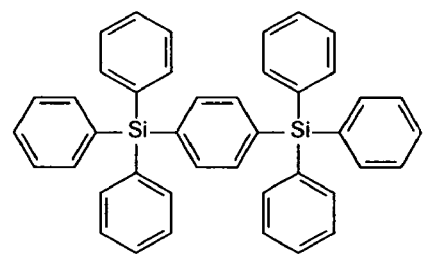

Data for the two phosphorescent are shown in FIGS. 13–16. The principal difference between the two devices is the presence or absence of an mCP layer between NPD and the emissive layer. Both devices give good efficiency (FIG. 13) and saturated blue emission (FIG. 15). It is noteworthy that with the doped $F_3$ layer the recombination center is close to the p-(SiPh$_3$)$_2$Ph (250 Å)/F$_3$ interface. In devices prepared with a BCP ETL and no mCP layer, strong NPD emission is observed leading to a marked decrease in device efficiency (external efficiency without the mCP layer is <1%). The high efficiency of these devices is also consistent with the $F_3$ layer being a good exciton and hole blocking layer, since loss of either of these into the $F_3$ layer would have led to a marked decrease in efficiency.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising:
   an anode;
   a cathode; and
   an organic layer disposed between the anode and the cathode,
      wherein the organic layer comprises a host material, an alkali metal or an alkaline earth metal, and a metal binding agent; and wherein
      (a) the metal binding agent is electrically neutral; or
      (b) the metal binding agent comprises a compatibilizer; or
      (c) the host material is selected from a material having the formula

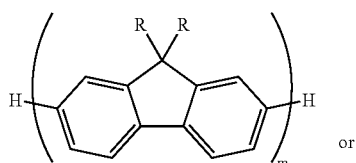

or

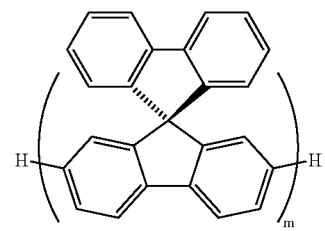

wherein m is 2 to 8 and each R is independently selected from alkyl, aryl and aralkyl; or (d) the metal binding agent is electrically neutral, and the metal binding agent comprises a compatibilizer; or (e) the metal binding agent is electrically neutral, and the host material is selected from a material having the formula

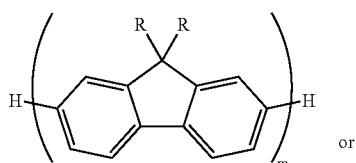

or

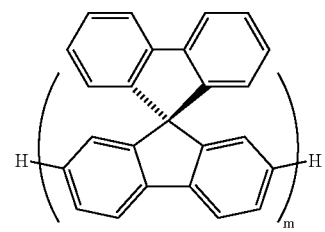

wherein m is 2 to 8 and each R is independently selected from alkyl, aryl and aralkyl; or (f) the metal binding agent comprises a compatibilizer, and the host material is selected from a material having the formula

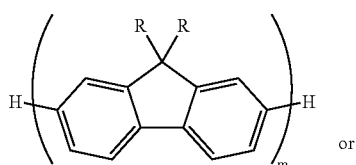

or

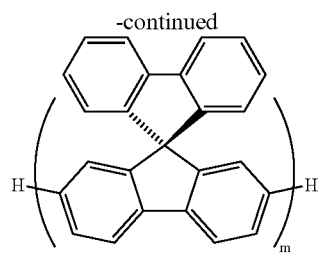

wherein m is 2 to 8 and each R is independently selected from alkyl, aryl and aralkyl; or (g) the metal binding agent is electrically neutral, the metal binding agent comprises a compatibilizer, and the host material is selected from a material having the formula

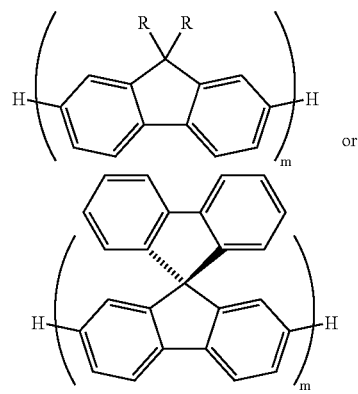

wherein m is 2 to 8 and each R is independently selected from alkyl, aryl and aralkyl.

2. The organic light emitting device of claim 1, wherein the organic layer is an electron transport layer.

3. The organic light emitting device of claim 2, wherein the device further comprises an emissive layer disposed between the electron transport layer and the anode.

4. The organic light emitting device of claim 3, wherein the organic layer comprises a first sublayer and a second sublayer, wherein the first sublayer is not doped with a metal binding agent, the second sublayer comprises the alkali metal or the alkaline earth metal, and the metal binding agent, and the first sublayer is nearer to the emissive layer than is the second sublayer.

5. The organic light emitting device of claim 4, wherein the first sublayer is in physical contact with the emissive layer.

6. The organic light emitting device of claim 1, wherein the organic layer is an emissive layer.

7. The organic light emitting device of claim 1, wherein the alkali metal is lithium.

8. The organic light emitting device of claim 1, wherein the metal binding agent is a crown ether.

9. The organic light emitting device of claim 1, wherein the metal binding agent is a cryptand.

10. The organic light emitting device of claim 2, wherein the host material is BCP.

11. An organic light emitting device comprising:
an anode;
a cathode;
a first organic layer disposed between the anode and the cathode, wherein
the first organic layer is an emissive layer; and
a second organic layer disposed between the first organic layer and the cathode, wherein
the second organic layer comprises an electron transporting host material, an alkali metal, and a metal binding agent; and wherein
(a) the metal binding agent is electrically neutral; or
(b) the metal binding agent comprises a compatibilizer; or
(c) the host material is selected from a material having the formula

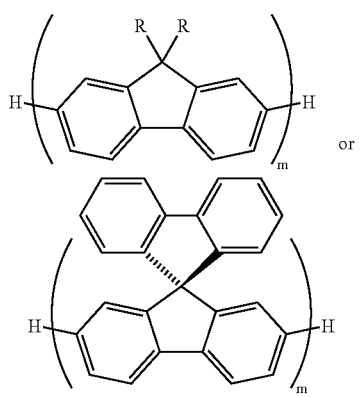

wherein m is 2 to 8 and each R is independently selected from alkyl, aryl and aralkyl; or
(d) the metal binding agent is electrically neutral, and the metal binding agent comprises a compatibilizer; or
(e) the metal binding agent is electrically neutral, and the host material is selected from a material having the formula

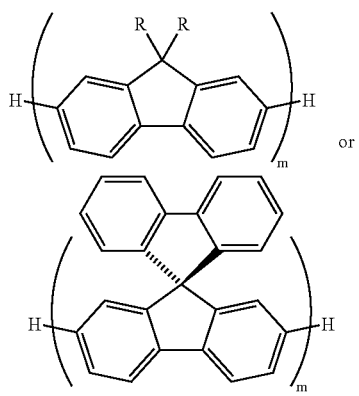

wherein m is 2 to 8 and each R is independently selected from alkyl, aryl and aralkyl; or
(f) the metal binding agent comprises a compatibilizer, and the host material is selected from a material having the formula

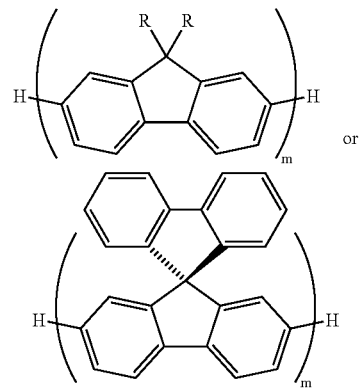

wherein m is 2 to 8 and each R is independently selected from alkyl, aryl and aralkyl; or
(g) the metal binding agent is electrically neutral, the metal binding agent comprises a compatibilizer, and the host material is selected from a material having the formula

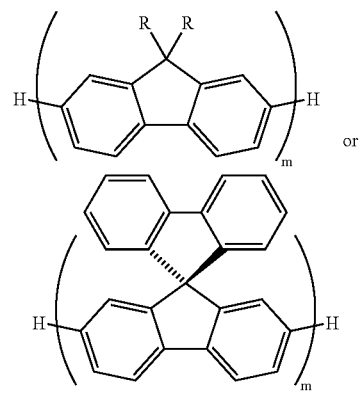

wherein m is 2 to 8 and each R is independently selected from alkyl, aryl and aralkyl.

12. The organic light emitting device of claim 11, wherein the second organic layer comprises a first sublayer and a second sublayer, wherein the first sublayer is not doped with a metal binding agent, the second sublayer comprises the alkali metal or the alkaline earth metal, and the metal binding agent, and the first sublayer is nearer to the first organic layer than is the second sublayer.

13. The organic light emitting device of claim 12, wherein the first sublayer is in physical contact with the first organic layer.

14. The organic light emitting device of claim 11, wherein the device further comprises a hole transport layer disposed between the first organic layer and the anode.

15. The organic light emitting device of claim 11, wherein the alkali metal is lithium.

16. The organic light emitting device of claim 11, wherein the metal binding agent is a crown ether.

17. The organic light emitting device of claim 11, wherein the metal binding agent is a cryptand.

18. The organic light emitting device of claim 11, wherein the electron transporting host material is BCP.

19. An organic light emitting device comprising:

an anode;

a cathode; and an organic layer disposed between the anode and the cathode, wherein the organic layer comprises a host material, an alkali metal or an alkaline earth metal, and a metal binding agent; and wherein the metal binding agent is electrically neutral.

* * * * *

UNITED STATES PATENT AND TRADEMARK OFFICE
CERTIFICATE OF CORRECTION

PATENT NO.      : 7,070,867 B2
APPLICATION NO. : 10/729547
DATED           : July 4, 2006
INVENTOR(S)     : Mark E. Thompson et al.

It is certified that error appears in the above-identified patent and that said Letters Patent is hereby corrected as shown below:

On the title page, Item (56), on the line beginning with "Shizuka et al ……." change the spacing so that this line reads --Dibenzo-18 -- and not "Dibenzo-1"

Column 3, lines 4-5, change "tris-(8-hydroxy. quinoline)" to -- tris (8-hydroxyquinoline) --

Column 4, line 16, change "Ir(4,6-$F_2$ ppy)$_2$" to -- Ir(4,6-$F_2$ppy)$_2$--

Column 4, line 32, change ""Ir(4,6-$F_2$ ppy)$_2$" to -- Ir(4,6-$F_2$ppy)$_2$--

Column 9, line 5, change "that" to --than--

Column 15, line 15, change "which have high a electron" to --which have a high electron--

Column 15, line 16, change "but have do not make effective" to -- but do not make effective --

Column 15, line 21, change "$cm^2$V-sec" to --$cm^2$/V-sec--

Column 15, line 22, change "$cm^2$ N-sec" to --$cm^2$/V-sec--

Column 17, line 65, insert a colon after "m-MTDATA"

Column 17, line 65, change (3-methylphenylphenlyamino)" to --(3-methylphenylphenylamino)--

Column 18, line 5, change "lr(Ppy)$_3$" to --Ir(ppy)$_3$--

Column 18, line 12, change "N—N" to --N-N--

Column 18, line 13, change "N—N" to --N-N--

Column 18, line 14, delete the tab after "BAlq:"

Column 18, line 14, change "(2-methyl-8-quinolinato)$_4$" to --(2-methyl-8-quinolinato)4--

Colunm 18, line 15, change "phenylphenylate" to --phenylphenolate--

Column 18, line 17, delete the tab after "DCM:"

Page 1 of 2

UNITED STATES PATENT AND TRADEMARK OFFICE
CERTIFICATE OF CORRECTION

PATENT NO. : 7,070,867 B2
APPLICATION NO. : 10/729547
DATED : July 4, 2006
INVENTOR(S) : Mark E. Thompson It is certified that error appears in the above-identified patent and that said Letters Patent is hereby corrected as shown below:

Colunm 18, line 23, change "$F_2$ ppy" to -- $F_2$ppy--

Column 18, line 23, insert a colon after "$BPz_4$"

Column 18, line 23, change "difluorphenyl" to --difluorophenyl--

Column 19, line 56, change "as" to --was--

Column 20, line 4, change "$F_2$ ppy" to -- $F_2$ppy--

Column 20, line 4, change "$BPZ_4$" to -- $BPz_4$--

Column 20, line 17, change "(1-naphthyl) -N" to --(1-naphthyl)-N--

Column 20, line 22, change "$F_2$ ppy" to -- $F_2$ppy--

Column 20, line 24, change "the" to --by--

Signed and Sealed this

Fourteenth Day of November, 2006

JON W. DUDAS
*Director of the United States Patent and Trademark Office*